United States Patent
Mitobe

(10) Patent No.: US 6,246,150 B1
(45) Date of Patent: *Jun. 12, 2001

(54) SURFACE ACOUSTIC WAVE DEVICE

(75) Inventor: Seiichi Mitobe, Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/428,993

(22) Filed: Oct. 28, 1999

(51) Int. Cl.$^7$ ................................................. H03H 9/25
(52) U.S. Cl. ................................. 310/313 B; 310/313 C
(58) Field of Search ....................... 310/313 R, 313 B, 310/313 C, 313 D; 333/193, 195

(56) References Cited

U.S. PATENT DOCUMENTS

| | | | |
|---|---|---|---|
| 4,162,465 | * 7/1979 | Hunsinger et al. | 310/313 B |
| 4,463,327 | 7/1984 | Suzuki et al. | 333/194 |
| 4,535,265 | 8/1985 | Kodama et al. | 310/313 C |
| 5,304,965 | * 4/1994 | Manner | 333/193 |
| 5,313,177 | * 5/1994 | Hichernell et al. | 333/193 |
| 5,438,306 | * 8/1995 | Yamanouchi et al. | 333/195 |
| 5,703,427 | * 12/1997 | Solal et al. | 310/313 D |
| 6,075,426 | * 6/2000 | Tsutsumi et al. | 333/193 |

FOREIGN PATENT DOCUMENTS

| | | | |
|---|---|---|---|
| 61-6917 | 1/1986 | (JP) | H03H/9/145 |
| 2-45364 | 10/1990 | (JP) | H03H/9/145 |
| 5-308242 | * 11/1993 | (JP) | 310/313 R |
| 620011 | * 8/1978 | (SU) | 333/193 |

OTHER PUBLICATIONS

SPUDT–Based Filters, Thomson Microsonics, URSI 25th General Assembly, Sep. 1996.*
Acoustic Surface Wave Filters, Tancrell et al., Proceedings of IEEE, vol. 59, No. 3, Mar. 1971.*

* cited by examiner

Primary Examiner—Thomas M. Dougherty
(74) Attorney, Agent, or Firm—Oblon, Spivak, McClelland, Maier & Neustadt, P.C.

(57) ABSTRACT

The present invention makes it possible to reduce amplitude ripple and group delay ripple in pass band, and to obtain flat frequency characteristics. A comb-like electrode includes electrode fingers . . . , which are grouped in pairs toward one side of a common electrode. A comb-like electrode includes electrode fingers . . . , which are grouped in pairs toward one side of a common electrode. Here, the electrode finger has a width narrower than $\lambda/8$, and the electrode finger has a width wider than $\lambda/8$ and has a deviation wx with respect to $\lambda/8$. In this case, there exist groups having different deviations wx in each of the groups. With this feature, it is possible to finely set a reflection amount with respect to surface acoustic wave, and to make the distribution of internal reflection sources continuous.

7 Claims, 6 Drawing Sheets

SURFACE ACOUSTIC WAVE DEVICE

BACKGROUND OF THE INVENTION

The present invention relates to a surface acoustic wave device (hereinafter called SAW filter) having corresponding comb-like electrodes.

In generally, an SAW filter is small in size, light in weigh and having high reliability. The SAW filter is used in a cellular phone and the like in a filed of a mobile communication system.

An intermediate frequency (IF) filter which is one of constituent components of the cellular phone is required to have narrow-band steep frequency characteristics with low loss, flat group delay characteristics and phase characteristics. In this SAW filter, an interdigital transducer (IDT) of a transversal filter type filter is used for obtaining the flat group delay characteristics.

Further, since narrow-band steep characteristics are required, a piezoelectric substrate in which the temperature dependence of frequency characteristic is small such as a crystal is used.

Further, it is known to set the transmitting direction of surface acoustic wave in the IDT into one direction to reduce insertion loss.

One type of unidirectional transducers is described in Jpn. Pat. Appln. KOKAI Publication No. 61-6917, for example. The unidirectional transducer described in Jpn. Pat. Appln. KOKAI Publication No. 61-6917 is of a structure so-called split electrodes or double electrodes in which a pair of comb-like electrodes are opposed on a piezoelectric substrate.

This unidirectional transducer comprises first and second opposed comb-like electrodes each including a large number of sets of electrode fingers, while each set including two electrode fingers. The first and second comb-like electrodes are arranged such that the sets of the comb-like electrodes are interdigitaly overlapped with each other. Here, when the two electrode fingers (first set) of the first comb-like electrodes are interdigitaly overlapped with the two electrode fingers (second set) of the second comb-like electrodes, a maximum distance in widthwise direction of disposition area of the four electrode fingers is $\lambda$ (wavelength of center frequency of surface acoustic wave). By selecting the width of the electrode finger within a range of this $\lambda$, a propagation direction of the surface acoustic wave is emphasized. However, in the case of the SAW filter, in addition to the selection of the propagation direction of the surface acoustic wave, it is necessary to pay attention to the fact that amplitude ripple and group delay ripple in a using frequency band must be suppressed. That is, in IDT, since triple transit echo (TTE: electric spurious multiple reflection) is generated, it is necessary to suppress the TTE.

In the above-described conventional SAW, measures for deleting the amplitude ripple and the group delay ripple in the using frequency band are insufficient.

BRIEF SUMMARY OF THE INVENTION

Thereupon, the present invention has been accomplished in view of the above problem, and it is an object of the invention to provide an SAW filter which excellently reduces amplitude ripple and group delay ripple in a using frequency band.

To achieve the above object, a surface acoustic wave device of the present invention comprises:
a piezoelectric substrate,
a first common electrode formed on the piezoelectric substrate,
a first comb-like electrode finger including a plurality of first electrode finger groups, the groups comprising a plurality of electrode fingers having distributed positive and negative deviations wx(wx=w1−($\lambda$/8), $\lambda$ is surface acoustic wavelength and w1 is a width of electrode finger) with respect to $\lambda$/8 in one finger group, and the plurality of first electrode finger groups connected with the first common electrode,
a second common electrode provided in parallel to the first common electrode on the piezoelectric substrate, and
a second com-like electrode finger including a plurality of second electrode finger groups, the groups comprising a plurality of electrode fingers having distributed positive and negative deviations wx(wx=w1−($\lambda$/8), $\lambda$ is surface acoustic wavelength and w1 is a width of electrode finger) with respect to $\lambda$/8 in one finger group, and the plurality of second electrode finger groups connected with the second common electrode, the second electrode finger groups being interdigitaly overlapped with the first electrode finger groups.
a second electrode fingers including a plurality of second finger groups which are interdigitaly overlapped with the plurality of first finger groups of the first comb-like electrode finger and which are projected from the second common electrode, each of the finger groups including therein a plurality of electrode fingers having positive and negative deviations wx with respect to $\lambda$/8 ($\lambda$ is surface acoustic wavelength), the deviations being formed differently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained with reference to the drawings below.

Figure 1:
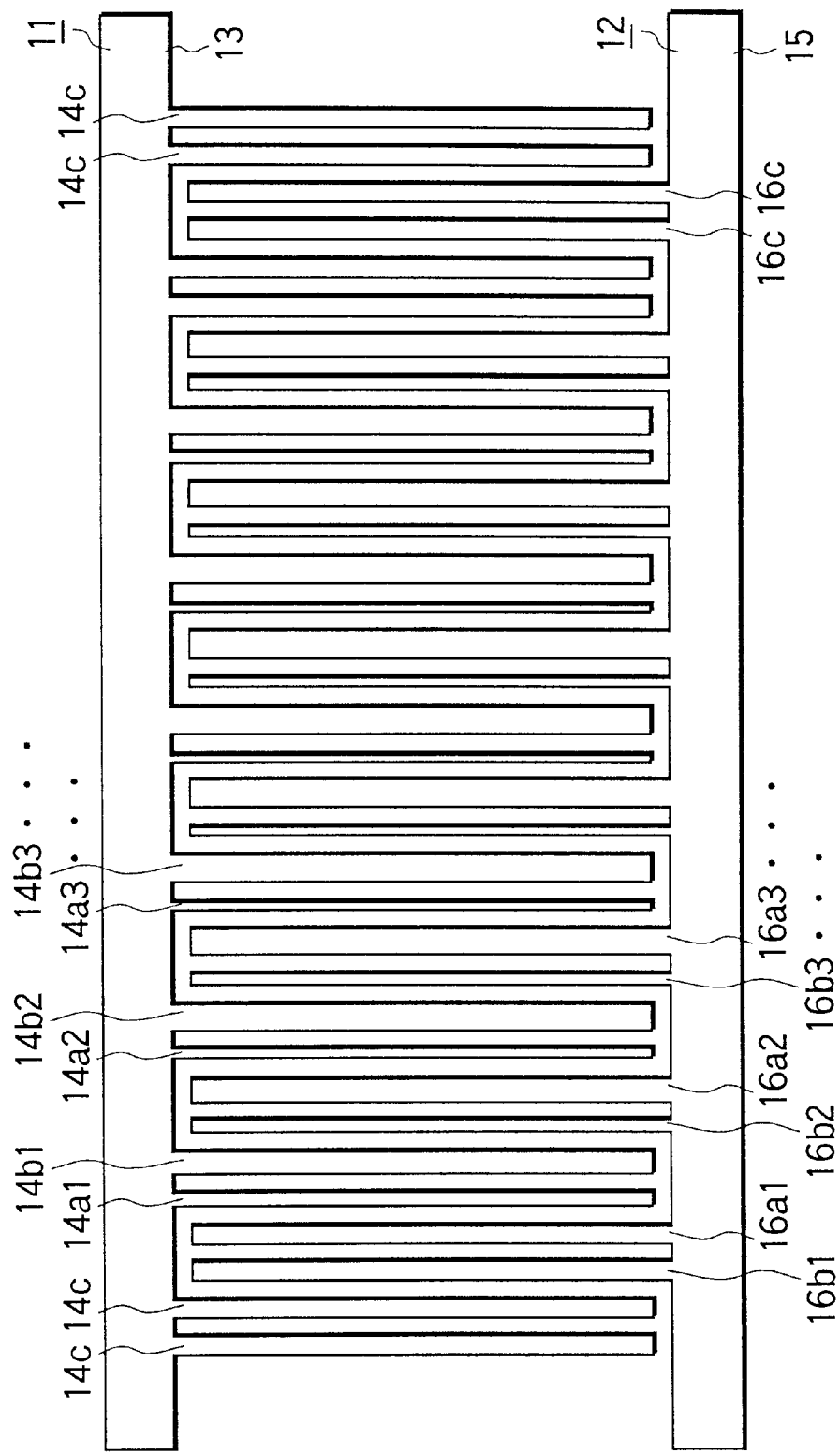
FIG. 1 is a view showing an essential portion of an embodiment of an SAW filter of the present invention.
Figure 2:
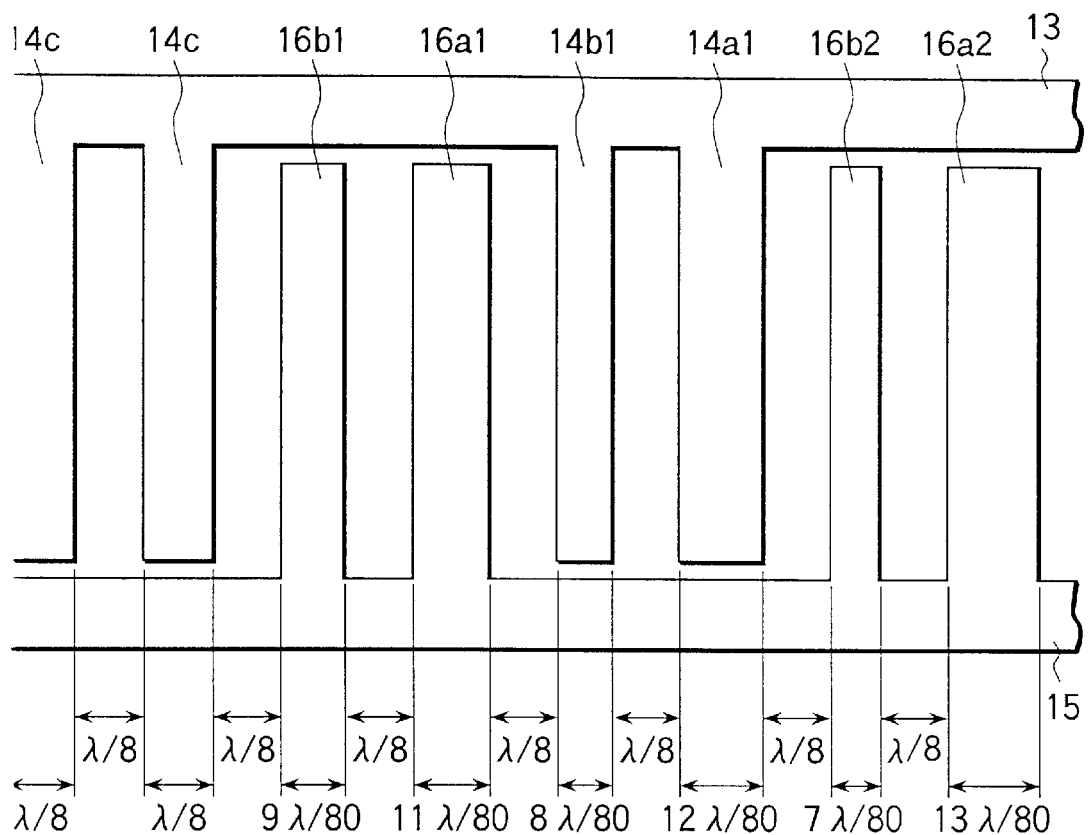
FIG. 2 is an enlarged view of a portion in FIG. 1.

An interdigital transducer which is an SAW filter shown in FIGS. 1 and 2 is of a structure so-called split electrodes or double electrodes. A pair of comb-like electrodes 11 and 12 are opposed on a piezoelectric substrate (not shown). The piezoelectric substrate is made of piezoelectric material such as crystal lithium niobate ($LiNbO_2$), lithium tantalate ($LiTaO_2$), rock crystal.

The first comb-like electrode 11 includes a common electrode 13, and electrode fingers 14a1, 14a2, . . . , 14b1, 14b2 . . . , and electrode fingers 14c and 14c connected with the common electrode 13.

The wide electrode finger 14a1 pairs up with the narrow electrode finger 14b1, and the wide electrode finger 14a2 pairs up with the narrow electrode finger 14b2. The electrode fingers 14c have the same width. That is, the wide electrode finger and the narrow electrode finger group together. The grouped electrode fingers are called a finger group. Thus, a plurality of first finger groups project from the first common electrode 13. Electrode fingers constituting the plurality of first finger group are called first comb-like electrode fingers. The center-to-center distance of the neighboring group is determined $\lambda$ (the wavelength of the center frequency SAW).

The second comb-like electrode 12 includes a second common electrode 15, and electrode fingers 16a1, 16a2, . . . , 16b1, 16b2, . . . , and electrode fingers 16c and 16c project toward one side of the second common electrode 15.

The wide electrode finger 16a1 pairs up with the narrow electrode finger 16b1, and the wide electrode finger 16a2 pairs up with the narrow electrode finger 16b2. In this comb-like electrode 12 also, the wide electrode finger and the narrow electrode finger group together. The grouped electrode fingers are called a finger group. Thus, a plurality of second finger groups connected with the second common electrode 15. Electrode fingers constituting the plurality of second finger group are called second comb-like electrode fingers.

Further, the electrode fingers 14a1, 14a2, . . . , are formed wider than $\lambda/8$, i.e., they a formed to have widths of $12\lambda/80$, $14\lambda/80$, . . . , respectively. The electrode fingers 14b1, 14b2, . . . , are formed narrower than $\lambda/8$, i.e., they are formed to have widths of $8\lambda/80$, $6\lambda/80$, . . . , respectively. A total width of each of the adjacent electrode fingers 14a1 and 14b1, the adjacent electrode fingers 14a2 and 14b2, and the adjacent electrode fingers 14c and 14c is $\lambda/4$.

Thus, a relation between an electrode width w1 of the narrow electrode finger and an electrode width w2 of wide electrode finger is $w2=(\lambda/4)-w1$.

In the second comb-like electrode 12 also, the electrode fingers 16a1, 16a2, . . . , are formed wider than $\lambda/8$, i.e., they are formed to have widths of $11\lambda/80$, $13\lambda/80$, . . . , respectively. The electrode fingers 16b1, 16b2, . . . are formed narrower than $\lambda/8$, i.e., they are formed to have widths of $9\lambda/80$, $7\lambda/80$, . . . , respectively. A total width of each of the adjacent electrode fingers 16a1 and 16b1 and the adjacent electrode fingers 16a2 and 16b2 is $\lambda/4$.

In the comb-like electrodes 11 and 12, the set of the electrode fingers 14a1, 14b1, the set of the electrode fingers 14a, 14b2, . . . , the set of the electrode fingers 16a2, 16b2, . . . , are alternately disposed. That is, the plurality of first finger groups and the plurality of second finger groups are interdigitaly overlapped with each other in groups.

The electrode fingers 14a1, 14b1, 14a2, 14b2, . . . 14c, 16a1, 16b1, 16a2, 16b2, . . . , are disposed in parallel, and a distance of each of the adjacent electrode fingers 14a1, 14b1, 14a2, 14b2, . . . , 14c, 16a1, 16b1, 16a2, 16b2, . . . , is $\lambda/8$.

Figure 3:
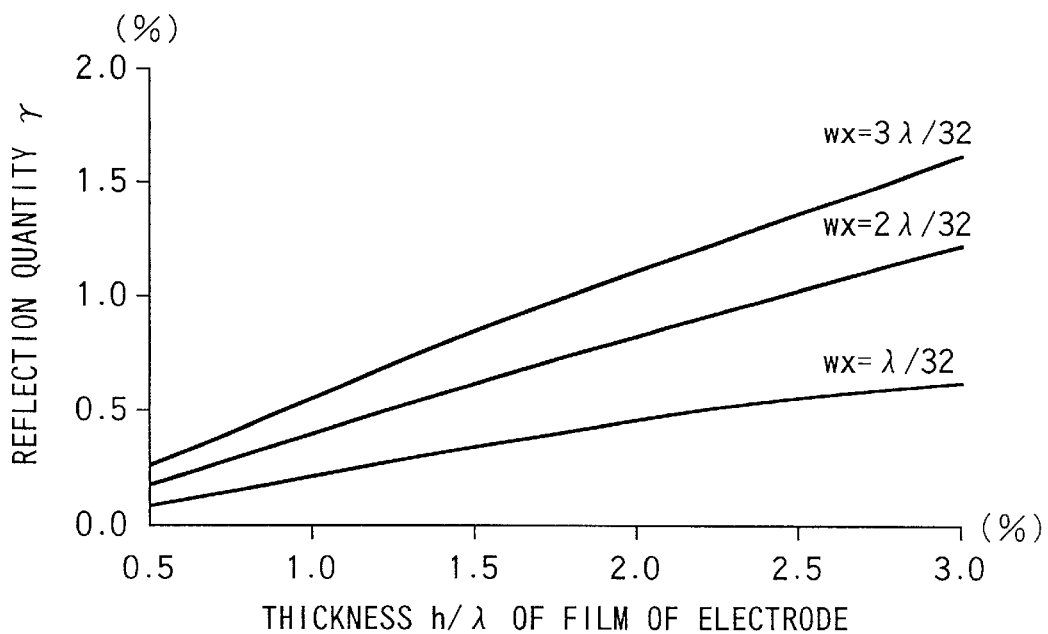
FIG. 3 is a graph showing a relation between a reflection amount $\gamma$ and an electrode film thickness h/$\lambda$.

FIG. 3 shows a relation between an electrode film thickness $h/\lambda$ and a reflection amount $\gamma$. The reflection amount $\gamma$ shows a ratio of related SAW amplitude from an edge of an electrode finger to the incident SAW at the center frequency defined as 1. There exist positive and negative values as the reflection amount because a phase of reflection wave is varied through 180°.

The reflection amount $\gamma$ is a reflection amount of two electrode fingers which pair up with each other. Widths of the two electrode fingers are $\lambda/16$ and $3\lambda/16$, respectively. The electrode film thickness $h/\lambda$ is represented by a ratio of a film thickness h and wavelength $\lambda$. The wavelength $\lambda$ is wavelength of the center frequency of the surface acoustic wave used.

Figure 4:
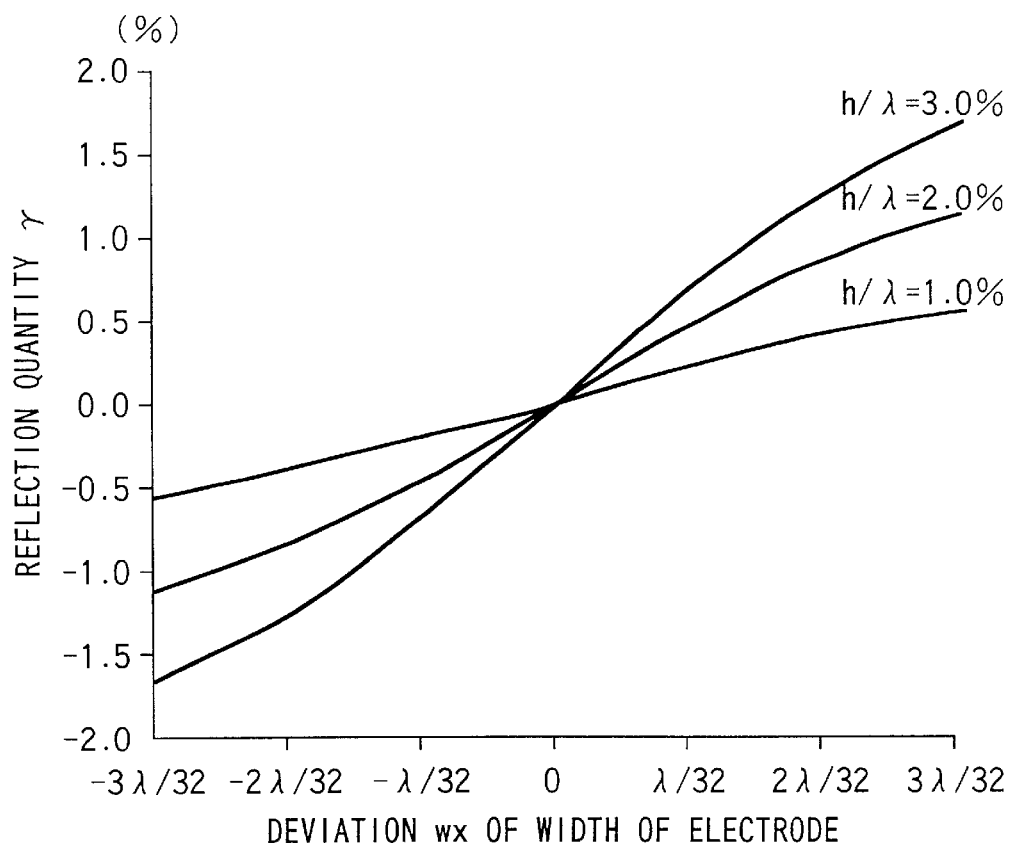
FIG. 4 is a graph showing a relation between a reflection amount $\gamma$ and a deviation in electrode width wx.

FIG. 4 shows a relation between a reflection amount $\gamma$ and a deviation in electrode width wx when the electrode film thickness $h/\lambda$ is set constant.

The electrode width deviation wx is a difference between the electrode width and $\lambda/8 [wx=w-(\lambda/8)]$. A negative value is a difference between an electrode width of a narrower electrode finger and $\lambda/8$, and a positive value is a difference between an electrode width of a wider electrode finger and $\lambda/8$.

As can be seen in FIG. 3, the electrode film thickness $h/\lambda$ and the reflection amount $\gamma$ are proportional to each other, and they are varied linearly. If the electrode film thickness $h/\lambda$ is made constant and the electrode width deviation wx is varied, it can be understood that the reflection amount $\gamma$ can be varied.

FIG. 4 shows variations in the reflection amount $\gamma$ when the electrode film thickness $h/\lambda$ is made constant and the electrode width deviation wx is varied. As can be seen in FIG. 4, electrode width deviation wx and the reflection amount $\gamma$ are proportional to each other, and they are varied substantially linearly. In a portion in which the electrode variation wx=0, i.e., an electrode width of a pair of electrode fingers is $\lambda/8$, the reflection amount $\gamma$ is 0. Depending the value of wx becomes positive or negative value, a symbol of the reflection amount is reversed, and this corresponds to a direction of unidirectional property. That is, it can be understood that in order to obtain a negative reflection amount, the directional property may be reversed.

Based on FIGS. 3 and 4, a distribution of internal reflection source can be represented by continuous distribution function. Theoretically, there exist an infinite number of combinations of the film thickness h and the electrode width deviation wx for realizing the distribution function of the internal reflection source. Therefore, after the film thickness h is determined, an electrode width deviation for realizing a desired reflection amount $\gamma$ is selected in the characteristic region in FIG. 4.

As described above, it can be understood that various reflection amount $\gamma$ can be controlled by selecting the electrode deviation wx. Thereupon, in the present invention, the reflection amount of the internal reflection source in the IDT can be finely and continuously varied. This means that the distribution function of the internal reflection source represents that the internal reflection source is continuously distributed.

As a result, it is possible to obtain a distribution of the internal reflection source which can effectively reduce (cancel) the amplitude ripple and the group delay ripple in pass band.

The present invention should not be limited to the above-described embodiment.

Figure 5:
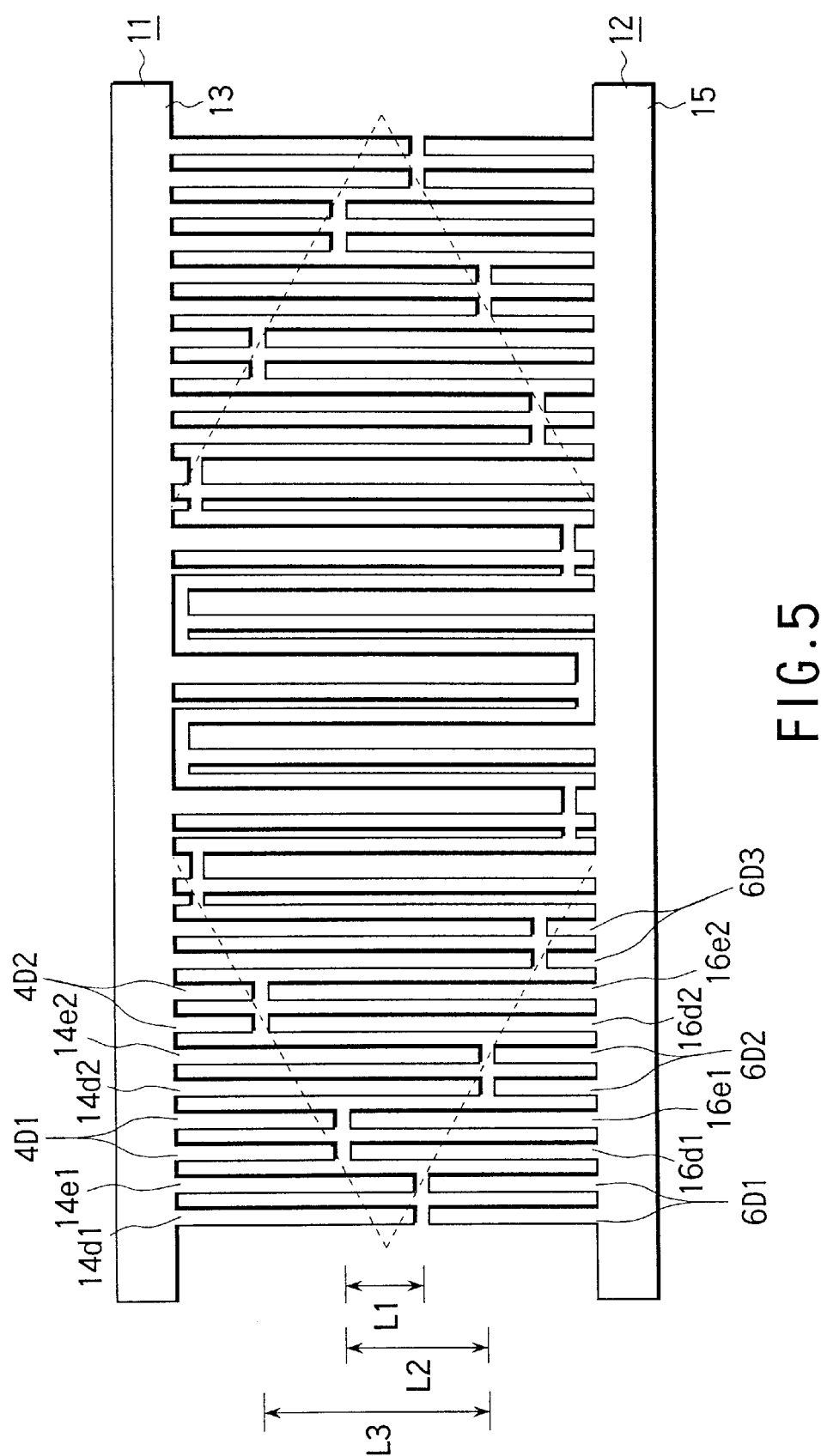
FIG. 5 is a view showing an essential portion of another embodiment of the SAW filter of the invention.

FIG. 5 shows another embodiment of the invention. This SAW filter is of anodized type. This is a type in which interdigitaly overlapping width of the electrode finger groups of the first and second comb-like electrodes 11 and 12 is varied as shown with chained line in the drawing. The basic idea of the present invention is applied to such a type also.

An overlapping width L1 of the electrode fingers 14d1, 14e1 and the electrode fingers 16d1, 16e1, an overlapping width L1 of the electrode fingers 16d1, 16e1 and the electrode fingers 14d2, 14e2, and an overlapping width L2 of the electrode fingers 14d2, 14e2 and the electrode fingers 16d2, 16e2 are gradually varied. This overlapping width is selected for reducing the reflection spurious and controlling the frequency characteristics.

Electrode groups 4D1, 4D2, . . . , 6D1, 6D2, 6D3, . . . projecting from opposed comb-like electrodes in a linear direction of each of the electrode fingers are electrode formed such that the surface acoustic wave is smoothly transmitted.

In the case of the above-described SAW filter also, as in the previous embodiment, electrode fingers having widths rather than $\lambda/8$ are included, and in a plurality of finger groups, plurality of first and second finger groups project from the sides of the first and second common electrodes 11 and 12 such that different deviations wx are distributed.

The deviation wx means that the electrode finger has a positive or negative difference (wx=w1−($\lambda/8$), w1 is an electrode finger width) with respect to $\lambda/8$ ($\lambda$ is a surface acoustic wavelength) as described above. The fact that the different deviations wx are distributed means that there exist a plurality of electrode fingers having positive and negative deviations wx with respect to $\lambda/8$ ($\lambda$ is surface acoustic wavelength) in one finger group, and in the plurality of finger groups, there exist groups having different deviations wx.

The present invention should not be limited to the above-described embodiment.

Figure 6:
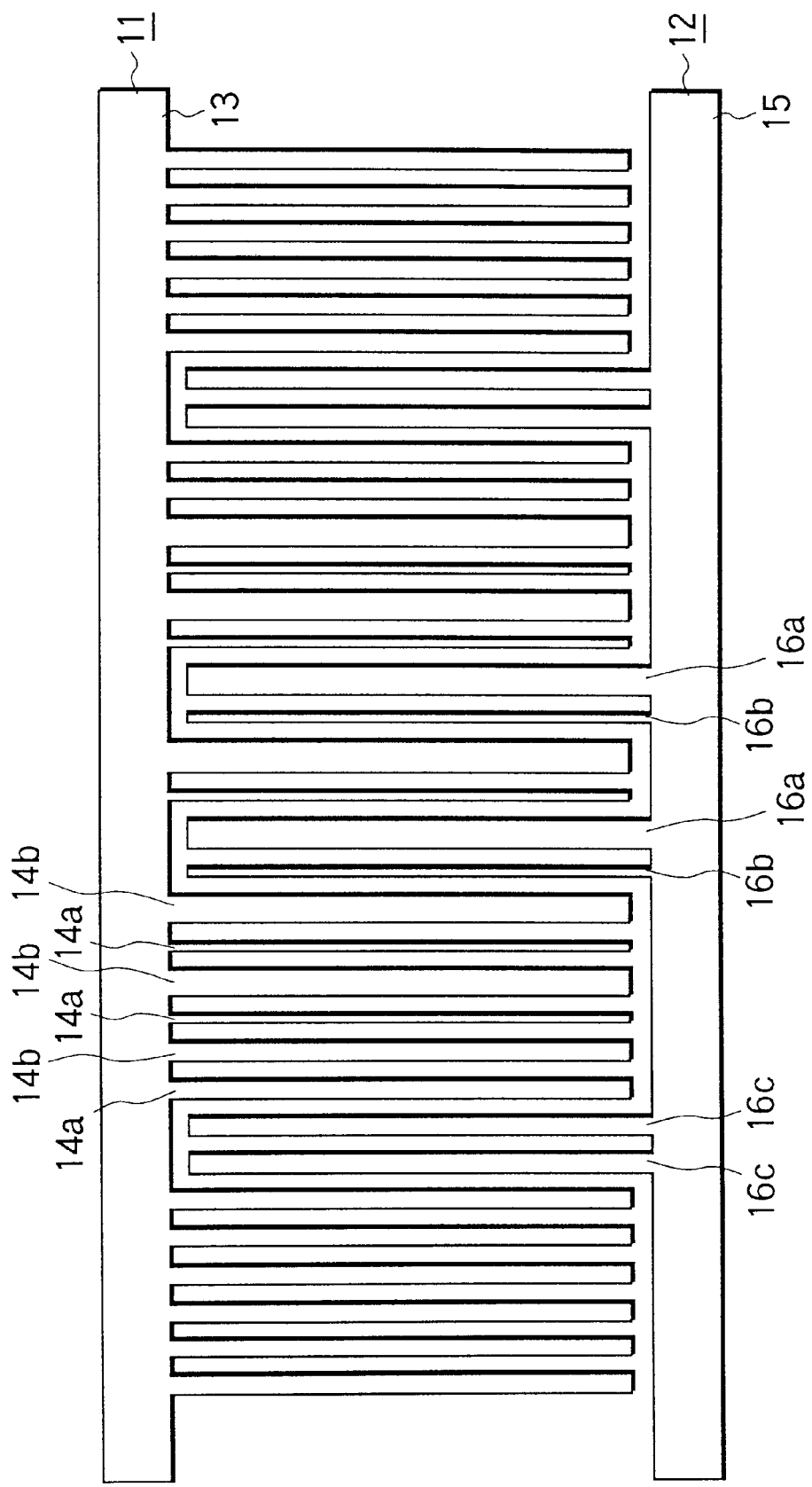
FIG. 6 is a view showing an essential portion of another embodiment of the SAW filter of the invention.

FIG. 6 shows another embodiment of the invention.

In the previous embodiment, two electrode fingers constituted one group. However, an SAW filter shown in FIG. 6 has a portion in which three or more electrodes constitute one group. By selecting the number of continuous electrode fingers in one group, it is possible to vary an exciting amount and as a result, it is possible to adjust the frequency characteristics.

In the example shown in FIG. 6, in the first comb-like electrode 11, there exists a portion in which six electrode fingers 14a, 14b, 14a, 14b, 14a, 14b form one group, and a portion in which only electrode fingers 14a and 14b form one group. In the second comb-like electrode 12 in the illustrated example, two electrode fingers 16a and 16b form one group, but the number of the electrode fingers may be increased.

In this embodiment also, as in the previous embodiment, electrode fingers having widths rather than $\lambda/8$ are included, and in a plurality of finger groups, plurality of first and second finger groups project from the sides of the first and second common electrodes 11 and 12 such that different deviations wx are distributed.

Figures 7A, 7B:
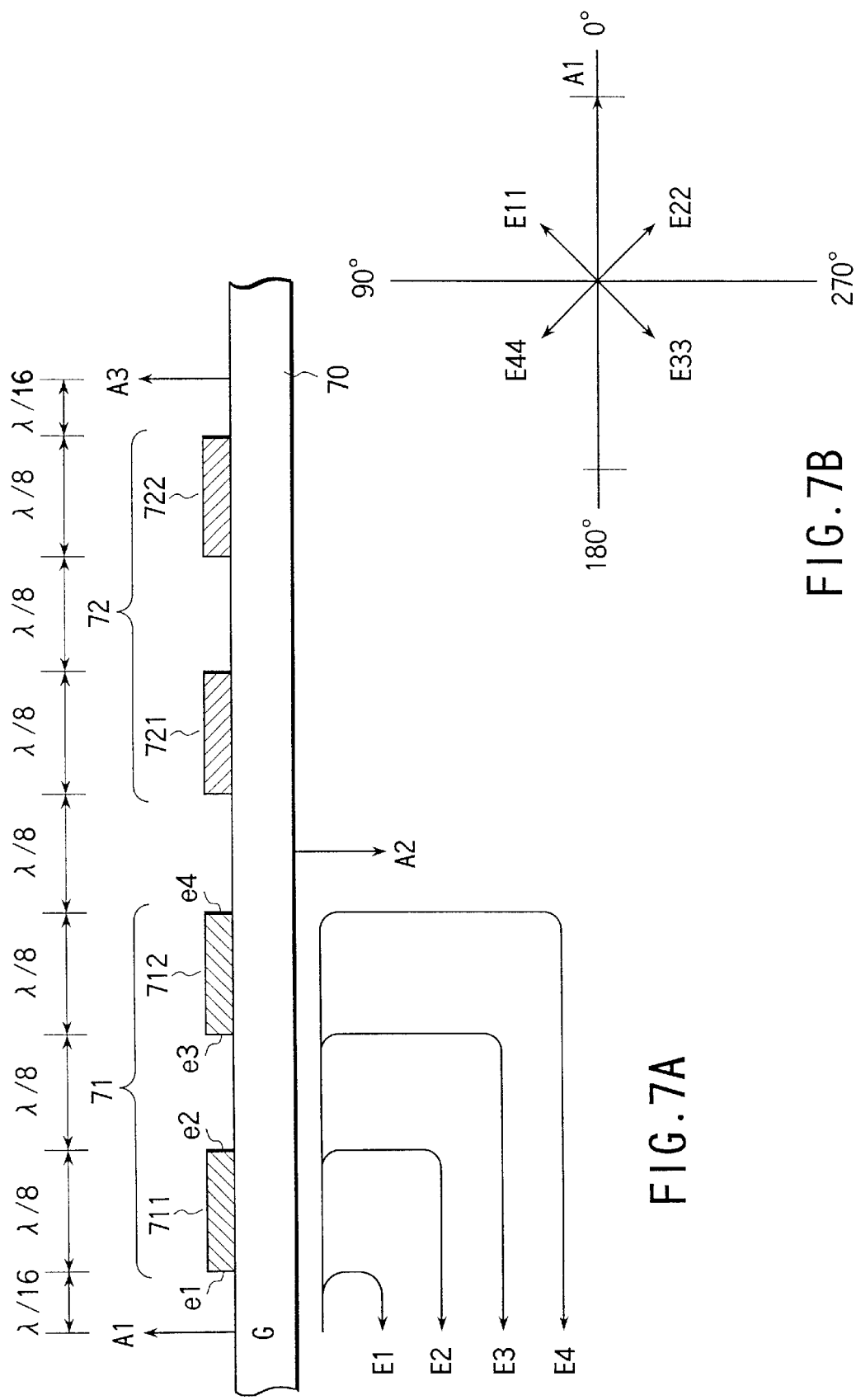
FIG. 7A is a partial sectional view for explaining an idea of an electrode of the SAW, vibration and a reflection position.
FIG. 7B is an explanatory view for explaining a phase of reflection wave of the SAW shown in FIG. 7A.

FIGS. 7A and 7B are explanatory views for explaining a basic idea for analyzing the internal reflection wave in the SAW filter of the present invention. In FIG. 7A, 70 represents a piezoelectric substrate, 71 represents a first comb-like electrode, and 711 and 712 represents paired electrode fingers of the first comb-like electrode 71. Whereas, 72 represents a second comb-like electrode, and 721 and 722 are paired electrode fingers of the second comb-like electrode 72. Arrows A1, A2 and A3 represent vectors showing vibration directions of the surface acoustic wave. Arrows E1, E2, E3 and E4 represent paths of reflection waves reflected from edges of the electrode fingers 711, 712.

FIG. 7B shows a vector A1 as well as vectors E11, E22, E33 and E44 of each of reflection waves. In FIG. 7B, a position where the vector A1 is generated is determined as an exciting position G by basic wave. Further, a distance from G to an edge e1 is ($\lambda/16$), a distance from G to an edge e2 is ($\lambda/16$)+($\lambda/8$), a distance from G to an edge e3 is ($\lambda/16$)+($\lambda/8$)+($\lambda/8$), and a distance from G to an edge e4 is ($\lambda/16$)+($\lambda/8$)+($\lambda/8$)+($\lambda/8$).

A reflection wave E11 from the edge e1 is a phase of ($\lambda/16$)×2(reciprocation)=$\lambda/8$. This is because if a phase of the vector A1 in FIG. 7B is 0°, $\lambda/8$ is a phase of 45. A reflection wave E22 from the edge e2 is a phase of −[($\lambda/16$)+($\lambda/8$)]×2(reciprocation)=−3$\lambda/8$. A reflection wave E33 from the edge e3 is a phase of [($\lambda/16$)+($\lambda/8$)+($\lambda/8$)]×2(reciprocation)=−5$\lambda/8$. A reflection wave E44 from the edge e4 is a phase of −[($\lambda/16$)+($\lambda/8$)+($\lambda/8$)+($\lambda/8$)]×2(reciprocation)=−7$\lambda/8$.

When the amplitudes of the reflection waves are equal to each other, all the reflection waves are canceled and become 0. As described above, the phase of the reflection waves can by controlled by the widths and positions of the electrode fingers, but in the present invention, as explained with reference to FIGS. 3 and 4, it is further possible to finely and continuously vary the reflection amount of the internal reflection sources in the IDT by introducing the idea that the deviations wx are distributed in the arrayed direction of the electrode fingers. This means that the distribution function of the internal reflection source indicates that the internal reflection sources are continuously distributed. And it is possible to obtain the distribution of internal reflection sources which can effectively reduce the amplitude ripple and the group delay ripple in the using frequency band.

Figure 8:
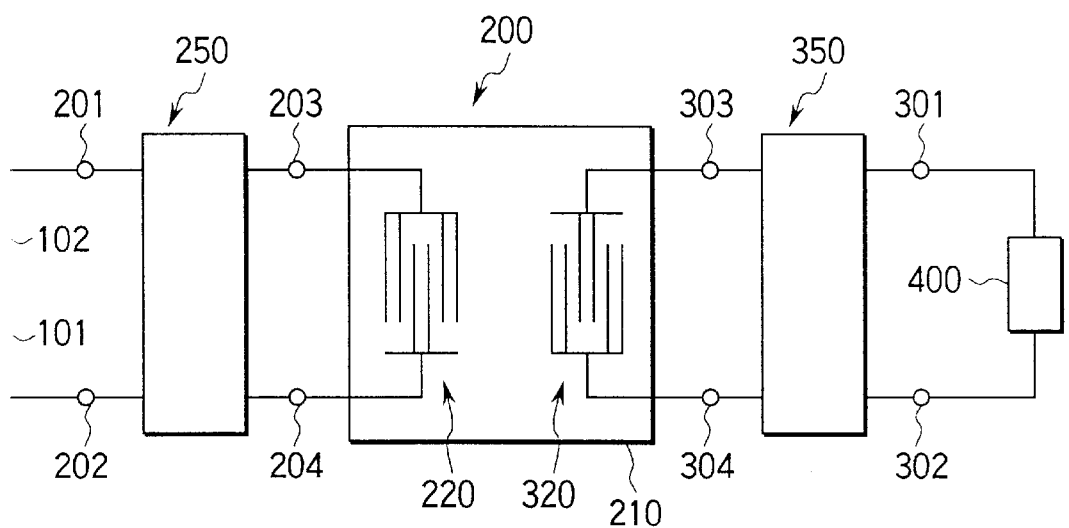
FIG. 8 is a view showing an example of a structure of a intermediate frequency filter device using the SAW of the invention.

FIG. 8 shows an example of a structure of an intermediate frequency filter device using an SAW filter 200 of the invention. One of terminal of a signal source 101 is connected to an input terminal 203 through a signal source impedance 102, a signal terminal 201 and an input alignment circuit 250. The other terminal of the signal source 101 is connected to another input terminal 204 through another signal terminal 202 and the input alignment circuit 250. The SAW filter 200 includes a piezoelectric substrate 210 on which an input side comb-like electrode area 220 and an output side comb-like electrode area 320 are provided. The present invention has been applied to each of the comb-like electrodes 220 and 320. A surface acoustic wave generated in the input side comb-like electrode 220 is propagated to the output side comb-like electrode area 320. A signal induced by a comb-like electrode provided in the output side comb-like electrode area 320 is sent out between output terminals 303 and 304. This signal is connected to one of load terminal 301 through an output terminal 303 and an output alignment circuit 350, and connected to the other output terminal 304 through the output alignment circuit 350, and supplied to a load circuit 400.

As described above, the present invention utilizes the first and second comb-like electrodes respectively having a plurality kinds of electrode fingers of width narrower than $\lambda/8$ and a plurality kinds of electrode fingers of width wider than $\lambda/8$. With this structure, it is possible to finely set the reflection amount of acoustic internal reflection sources for canceling the electric reflection and as a result, it is possible to make the distribution of the internal reflection sources continuous and fine. Therefore, it is possible to reduce amplitude ripple and group delay ripple in a frequency band in the filter characteristics. Further, the present invention is especially effectively used in a mobile communication system requiring a wide band width in spite of intermediate frequency filter such as a narrow-band CDMA of band width of 1.25 MHz or a wide-band CDMA system of band width of 5 MHz, and ripple suppression in using frequency band can be carried out. The filter of the present invention can be used in a range from some tens MHz to standard microwave band, and can be applied as a filter used in frequency band. The present invention can also be used in an intermediate frequency filter, an antenna resonator, an interstage filter and the like. In a high frequency band, wavelength of surface acoustic wave is about 1 $\mu$m in 1 GHz, and extremely fine working technique is required for the electrode finger. As the working technique, the is a photolithography manufacturing technique like the LSI manufacture.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A surface acoustic wave device comprising:

a piezoelectric substrate;

a first common electrode formed on the piezoelectric substrate;

a first comb-like electrode finger arrangement including a plurality of first electrode finger groups connected with the first common electrode, said first electrode finger groups comprising one first finger group having a plurality of first electrode fingers having a plurality of different distributed first positive finger width deviations that have different values greater than a value of $\lambda/8$ and a plurality of different distributed negative first finger width deviations that have different values less than a value of $\lambda/8$, wherein $\lambda$ is surface acoustic wavelength;

a second common electrode provided in parallel to the first common electrode on the piezoelectric substrate; and a second comb-like electrode finger arrangement including a plurality of second electrode finger groups connected with the second common electrode, said second electrode finger groups comprising one second finger group having a plurality of second electrode fingers having a plurality of different distributed second positive finger width deviations that have different values greater than a value of $\lambda/8$ and a plurality of different distributed negative second finger width deviations that have different values less than the value of $\lambda/8$, wherein said second electrode finger groups are interdigitaly overlapped with said first electrode finger groups.

2. The surface acoustic wave device according to claim 1, wherein the first and second plurality of electrode fingers each include an electrode finger having a width of $\lambda/8$.

3. The surface acoustic wave device according to claim 1, wherein the one first electrode finger group and the one second electrode finger group each comprises two electrode fingers, and a total width of the two fingers combined in each group has a value of $\lambda/4$.

4. The surface acoustic wave device according to claim 1, wherein an overlapping length of the first electrode finger groups and the second finger groups is varied.

5. The surface acoustic wave device according to claim 1, wherein the one first electrode finger group and the one second electrode finger group each comprises three or more electrode fingers.

6. The surface acoustic wave device according to claim 1, wherein a dummy electrode is formed on an extension line of the plurality of electrode fingers such as to be linearly opposed thereto.

7. The surface acoustic wave device according to claim 1, wherein the plurality of different distributed positive first and second finger width deviations and the plurality of different distributed negative first and second finger width deviations are selected for weighting internal reflection.

* * * * *